United States Patent [19]

Sandusky

[11] Patent Number: 4,829,267
[45] Date of Patent: May 9, 1989

[54] AUTOMATIC DC RESTORER STAGE FOR SERVO DATA AMPLIFIER

[75] Inventor: Randall L. Sandusky, Woodland Park, Colo.

[73] Assignee: Digital Equipment Corporation, Maynard, Mass.

[21] Appl. No.: 93,220

[22] Filed: Sep. 4, 1987

[51] Int. Cl.$^4$ ............................................. H03F 3/45
[52] U.S. Cl. ................................... 330/259; 330/257
[58] Field of Search ............... 330/252, 257, 259, 260, 330/261

[56] References Cited

FOREIGN PATENT DOCUMENTS 0261907 11/1986 Japan .................... 330/259

*Primary Examiner*—Gene Wan
*Attorney, Agent, or Firm*—Kenyon & Kenyon

[57] ABSTRACT

A method and apparatus for automatically restoring the DC signal level of recorded servo information which has been electronically recovered from a rotating disk storage device has a high gain differential amplifier which is connected to sense the DC level of the signal relative to a reference potential, and generate an error current. The resultant current is integrated to generate a potential and corresponding current, which is then applied via a feedback loop to adjust the DC level of the input signal. DC restoration is performed without altering the bias conditions of the preceeding amplifier stages, and is not dependent on waveform symmetry.

8 Claims, 5 Drawing Sheets

AUTOMATIC DC RESTORER STAGE FOR SERVO DATA AMPLIFIER

BACKGROUND OF THE INVENTION

This invention relates to disk drives in general and more particularly to a method and apparatus for accurately restoring the DC signal level of recorded servo information which has been electronically recovered from a rotating disk storage device.

A block diagram of a typical servo recovery channel for a disk drive is shown in FIG. 1. The recorded servo information on disk 11, which has been recovered by the servo head 13, is then amplified and filtered by preamplifier 15, low pass filter 17, amplifier 19, and band pas filter 21 to amplify the signal while eliminating the unwanted frequency components. An automatic gain control (AGC) loop 23, including variable gain amplifier 25, amplifier 27, and the AGC sense and feedback circuit 29 then amplifies the servo signal to its final value determined by the reference voltage Vagc, and maintains it at that value through the action of the feedback loop.

Since amplifiers 25 and 27 are commonly DC-coupled, a significant shift in the DC component of the signal occurs. This is corrected by the automatic DC restore circuit 31, which accurately restores the DC level (baseline) of the signal to a value (determined by Vref) which is maintained constant regardless of amplifier bias conditions or signal degradation. The analog servo data signal is then demodulated with reference to its DC-restored level by peak detectors 33, and is also converted to digital timing pulses by pulse digitizer 35. So that accurate head position and disk timing information can be obtained, it is essential that the servo signal be DC-restored with respect to its true signal baseline so that demodulation and digitization can reliably occur.

Two methods are commonly used to perform DC restoration in the field of disk storage devices. The first and most obvious solution is to passively AC couple the output of the servo data amplifier 27 to any subsequent circuits. Since the AC coupling capacitor effectively eliminates the low impedance drive capability of the amplifier, it then becomes necessary to restore this feature with a high performance buffer.

A more common approach used in the prior art, however, is depicted in FIG. 2. In this method, the DC restore circuit 31 includes a low pass filter 41 and integrating amplifier 43. The signal present at the output of amplifier 27 is filtered by low pas filter 41 to attenuate the AC components of the signal, while allowing the DC and low frequency components to pass. An integrating amplifier 43 then compares this DC level with a reference voltage (typically ground), and generates an error voltage which is then fed back to the input of amplifier 27. Due to the application of negative feedback, the bias conditions of amplifier 27 will be adjusted to correct for any DC offset present at Vout.

Since it is the object of the aforementioned method to extract the DC components of the signal with the use of a low pass filter, there is in practice a major disadvantage which attends such designs. Due to the action of the low pass filter, a pseudo-baseline (DC) level is created by time-averaging the positive and negative excursions of the signal. This DC level will be affected by any distortion present in the servo signal, which in practice is common due to an imperfect head-disk interface (HDI) or the poor performance of the preceding servo recovery circuits, thus exhibiting an offset with respect to the true signal baseline. In actuality, this offset is an error inherent to the operation of this type of DC restore circuit which will be passed on to any subsequent circuits.

In addition, since it is the object of the prior art method to adjust the DC level at the output of amplifier 27 by adjusting the input bias conditions of the amplifier, there are additional disadvantages which must be considered. For instance, since bias correction is often applied to the input stage of the amplifier, the input impedance of the amplifier will vary thus affecting the performance of the preceding circuits. A reduction in the dynamic range of the amplifier will also be observed since the DC restore circuit must compensate for component tolerances inherent in the amplifier itself.

It is therefore an object of this invention to provide a novel DC restore apparatus which eliminates the aforementioned disadvantages common to prior art methods of DC restoration. Related patent son this subject are U.S. Pat. Nos. 4,373,140; 3,846,710; 3,579,123; and 3,557,305.

SUMMARY OF THE INVENTION

Referring to FIG. 3, a block diagram of the invention is shown in an application such as is common to a disk storage device. The automatic DC restore stage 49 receives its input from a servo data amplifier 50 which corresponds to amplifier 27 in FIG. 1. Amplifier 50 typically includes a first stage with transistors Q20 and Q21, and a second stage with transistors Q22 and Q23, although more than two stages may be used in some applications. Due to the frequency components of the servo signal, capacitive coupling between the amplifier stages is unsatisfactory therefore requiring DC coupling between stages to achieve the desired performance. This is due not only to the large size of the capacitors, but also the tendency of the capacitors to charge up on signal peaks which forward bias the transistor junctions more heavily. Since DC coupling is desired for optimum performance, significant shifts in the quiescent potential of the signal will occur such that the voltage at the collector of Q23 in amplifier 50 may be several volts above the desired value. The automatic DC restore stage 49 effectively maintains the proper quiescent potential at Vout regardless of the magnitude of the quiescent potential at Vin, or variations thereof. The quiescent potential at Vout is determined by the potential of Vref and can be any value within the operating range of the invention as may be required by the subsequent servo recovery circuits.

Since the invention operates independently of the preceding amplifier stages, the problems associated with altering the bias conditions of the previous stages are eliminated. This also allows the DC restore stage to possess a characteristic response which will not effect the response of the preceding amplifier in any way.

It is also the object of this invention to eliminate the need for a low pass filter as is common in prior art circuits. Since the invention directly detects the baseline voltage of the signal, the utility of the invention is in its ability to DC restore the signal with reference to its true baseline voltage and not a psuedo-baseline voltage created by filtering the signal itself as was done in the prior art. This therefore reduces the effects of signal distortion on the DC restoration process, providing improved performance when the HDI or the preceding servo recovery circuits are not ideal.

In addition to the above advantages, several other features make the use of the present invention desirable over prior art methods. These include the following:

1. The circuit is self-compensating; all component tolerances and temperature dependencies are nulled.
2. It eliminates reactive coupling. Large capacitors which are often used for coupling or filtering are no longer needed.
3. It is easily integrable. An embodiment of the invention in integrated circuit form utilizes all the attendant advantages of such construction.

The present invention provides improved performance. If the servo signal cannot be reliably DC restored, the seek performance of the drive will be degraded. This is due to inaccurate head position and velocity information provided when demodulation cannot occur properly. Because it reliably restores the DC level, the present invention overcomes this problem.

Furthermore, reliability is increased. Since the present invention can be implemented in an integrated circuit, long term reliability will be higher than that of a discrete design.

Implementation in integrated circuit form also reduces the number of components as would be required for a discrete design thereby reducing the cost. A space savings is realized.

These benefits have been realized in one implementation of a disk drive where the invention was used in an effort to increase reliability and reduce cost. In that particular application, approximately 10 components were eliminated through the use of this invention. Other implementations of the invention would result in even greater savings.

DETAILED DESCRIPTION

Figure 1:
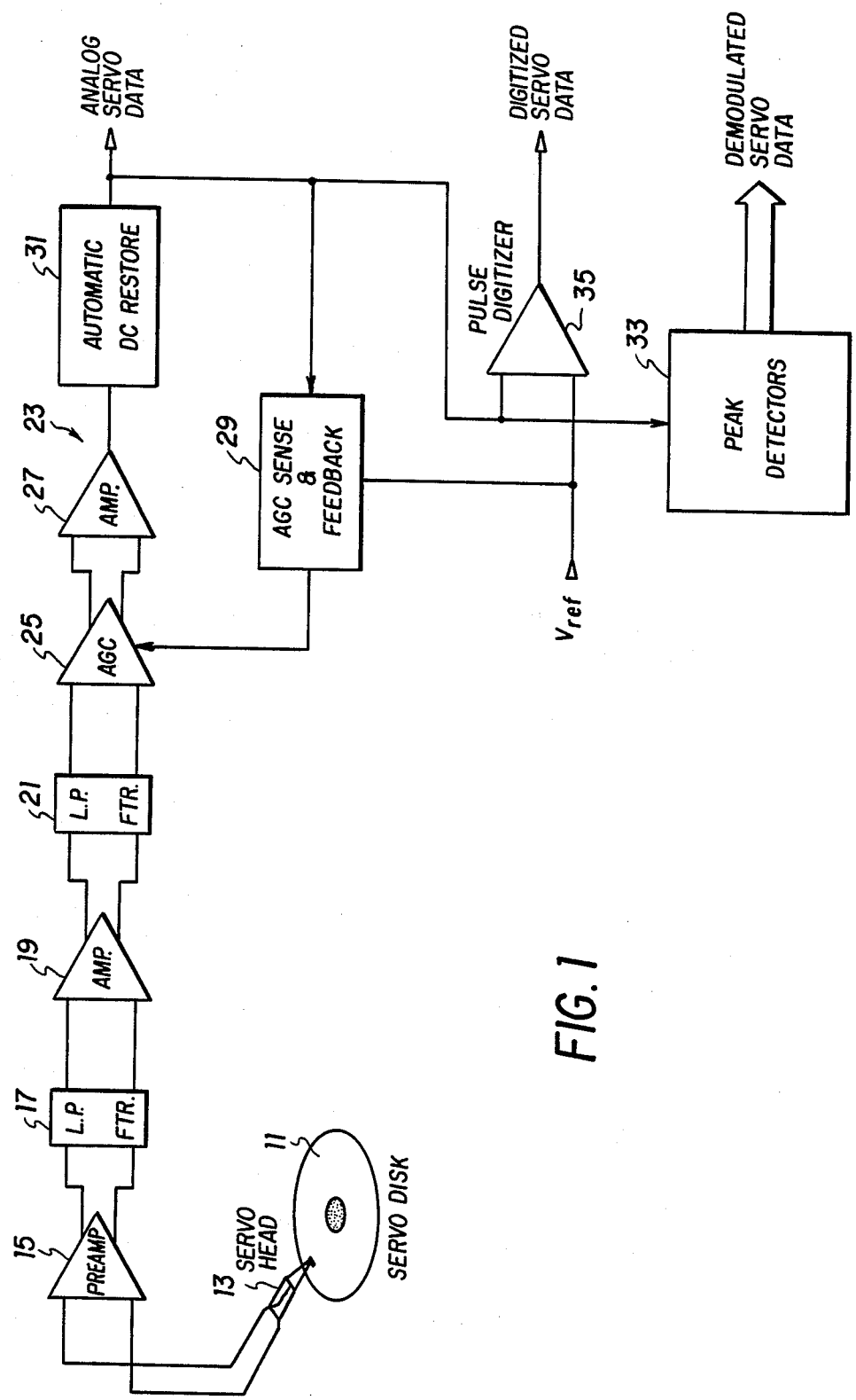
FIG. 1 is a block diagram of a typical dedicated servo recovery channel in which the invention may be used.
Figure 2:
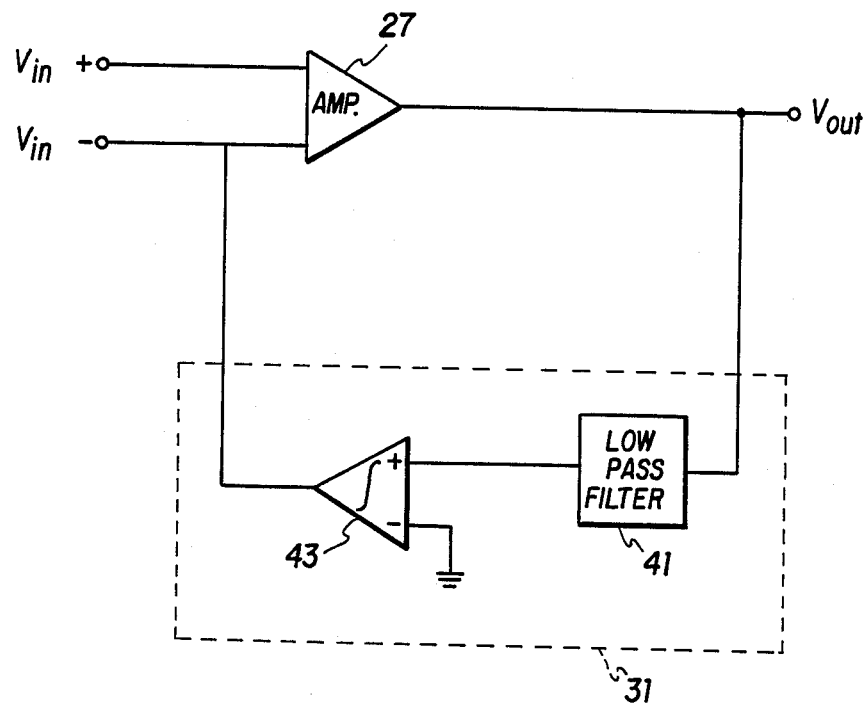
FIG. 2 is a block diagram of a prior art DC restore stage.
Figure 3:
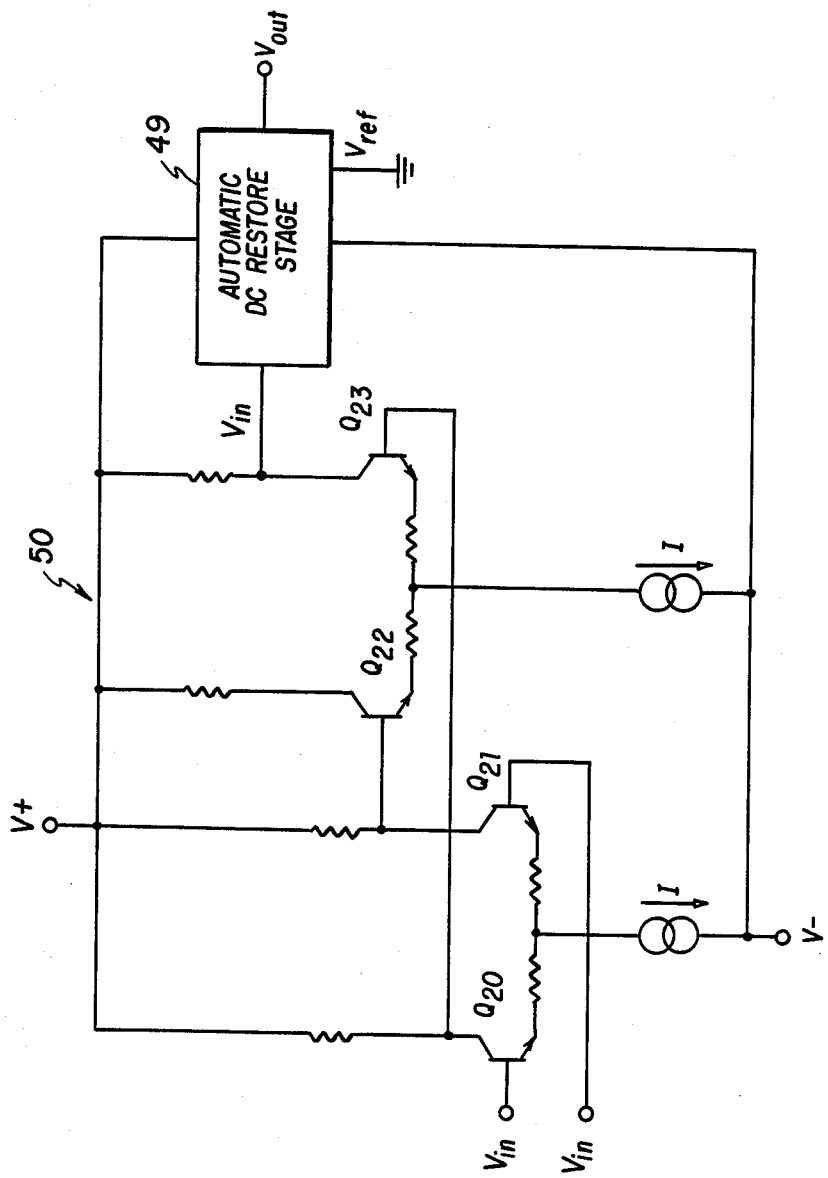
FIG. 3 is a block diagram of an application of the present invention such as is common to a disk storage device.
Figure 4:
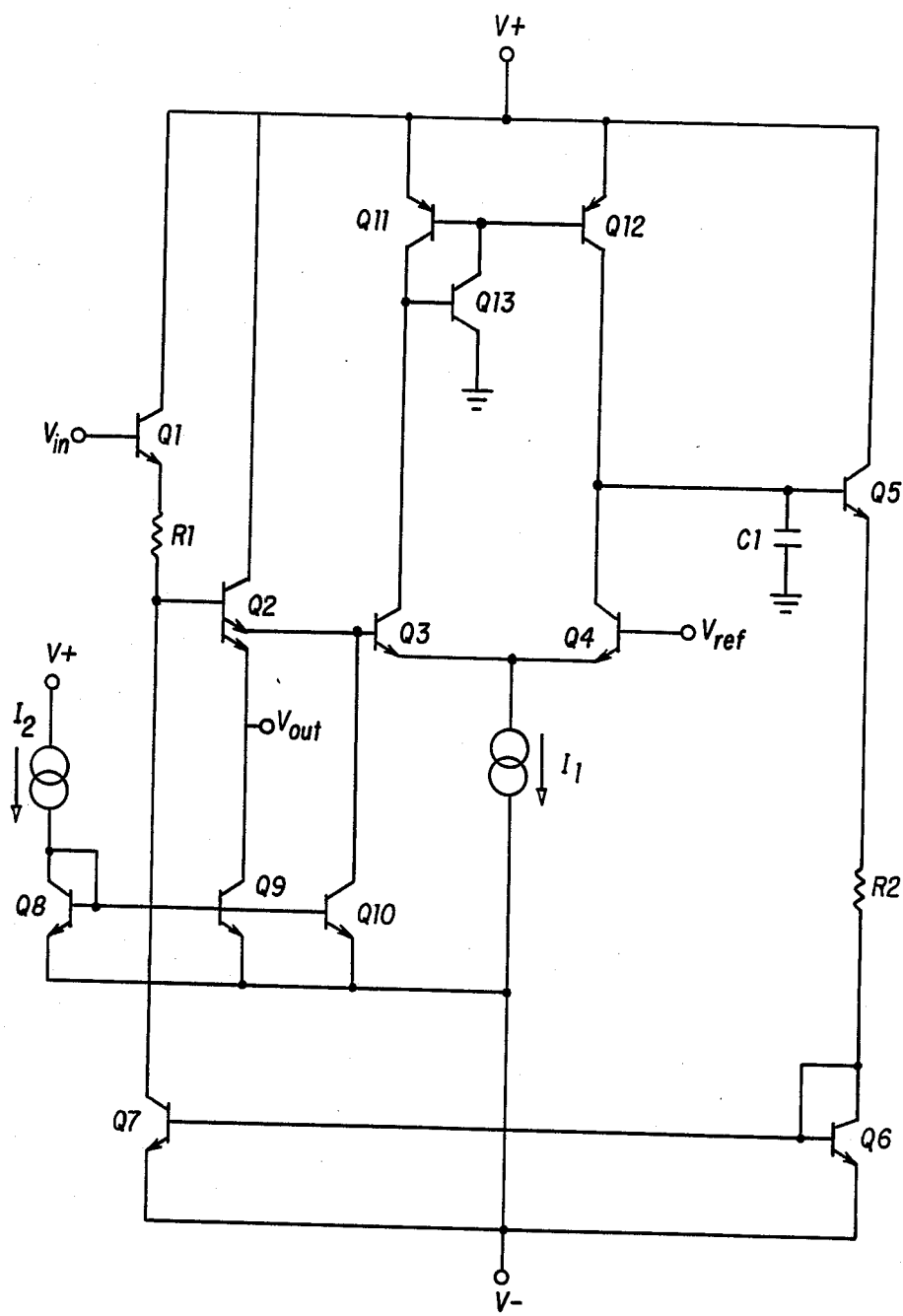
FIG. 4 is the circuit diagram of an embodiment of the invention.

Referring now to FIG. 4, a circuit diagram is shown of an embodiment of the invention. It should be noted that the circuit can be easily implemented in integrated circuit form, with the exception of C1 which must be an external component due to its size.

In FIG. 4, transistor Q1 is an emitter-follower which provides a high input impedance for the amplified servo readback signal present at Vin. The quiescent potential of this signal is typically several volts higher than the desired value due to the bias conditions of the servo data amplifier. It is therefore necessary to shift the quiescent potential of the signal down to a reference level for use by the subsequent circuits. This voltage drop is achieved through the base-emitter voltage drops of Q1 and Q2, and the voltage drop across R1. Vout, which is the DC restored signal, is maintained at the reference potential through current feedback which is applied to resistor R1 by the collector of Q7.

Transistors Q3 and Q4 are connected as a differential pair to implement an amplifier which has one emitter of Q2 as its active input, and Vref as a reference level input. Transistors Q11–Q13 are configured as an active load for the amplifier to achieve very high gain and output impedance. To provide isolation between the amplifier input and the load present at Vout, transistor Q2 is comprised of two independent emitters which are equal in area. Transistors such as this are commonly used in present day integrated circuits to provide close matching between signals which require isolation such as this. Current densities in the emitters of Q2 are matched through the use of transistors Q8–Q10 which are arranged as a current mirror. Current source I2 is simply a resistor connected between V+ and the collector of Q8. Current source I1 is not critical and at the discretion of the designer can be either active or passive.

The output of the differential amplifier is connected to capacitor C1 which serves to integrate the current added to or subtracted from that node, generating a voltage at the base of transistor Q5. This voltage is then buffered by the emitter-follower action of Q5 and applied to resistor R2 where a corresponding current is generated for use by the current mirror comprised of transistors Q6 and Q7. As the voltage at the base of Q5 increases, so does the current through resistor R2, and vice-versa. This current is then mirrored by the collector of transistor Q7 where it is applied to resistor R1 to obtain the voltage drop necessary to maintain Vout at the reference potential.

Figure 5:
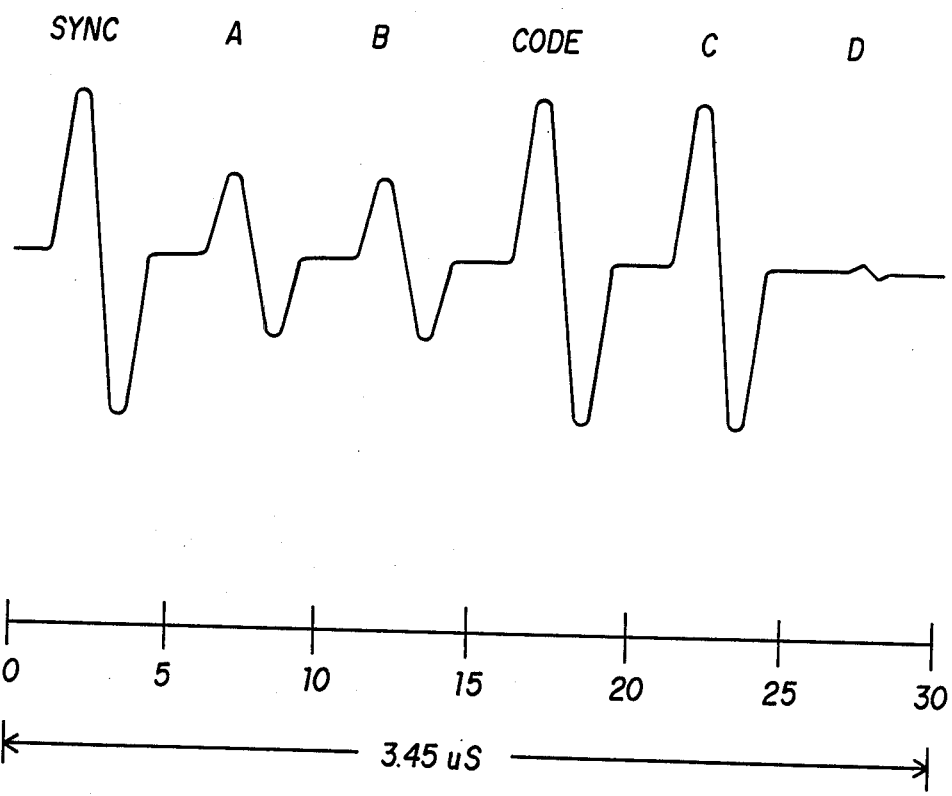
FIG. 5 illustrates a typical servo readback signal which would be DC restored by the present invention.

In typical operation, the signal to be DC-restored is received at the base of transistor Q3 (virtual Vout) having a quiescent potential of either positive or negative polarity with respect to the reference potential Vref. In actuality, a typical servo readback signal as is shown in FIG. 5, is one which contains both AC (non-zero) and DC signal components. In response to this input, an error current will be generated by the differential amplifier (transistors Q3, Q4, and Q11–Q13) to be added to or subtracted from capacitor C1. More specifically, for DC-level signal components $-2V_t$ but $+2V_t$ in magnitude, where $V_t$ is the thermal voltage of the transistors, the differential amplifier operates in its linear range causing a fraction of the current I1 to be applied to capacitor C1. If the polarity of the signal is positive with respect to Vref, transistor Q3 will be biased more heavily into conduction than transistor Q4. The corresponding current will be added to capacitor C1, which will in time increase the voltage at the base of Q5. If the polarity of Vout is negative with respect to Vref, transistor Q4 will be biased more heavily into conduction than transistor Q3. This in turn will cause a fraction of the current I1 to be subtracted from capacitor C1, in time reducing the voltage at the base of Q5.

For AC (non-zero) signal components, the differential amplifier will operate as a saturation mode comparator, causing the full current I1 to charge or discharge capacitor C1 in a manner similar to that described above.

The voltage developed at the base of Q5 is calculated to be equal to the time integral of current applied to capacitor C1 divided by its capacitance. Since the voltage on the capacitor cannot change instantaneously, and since the signal waveform contains AC components which alternate in polarity, the voltage developed at the base of Q5 assumes an average value relative to the time integral of the waveform itself. Furthermore, since the signal also contains DC-level (baseline) components, true DC recovery information independent of distortion effects is provided to aid in the DC restoration process. The size of capacitor C1 is only dependent on the low frequency response of the automatic DC restorer stage, and can be calculated from the charge/discharge time constant of the capacitor. In essence, the voltage developed at the base of Q5 is the voltage that is necessary to produce the desired shift in the quiescent potential of the signal from Vin to Vout, performing DC restoration. This voltage shift is achieved through the current feedback applied to resistor R1 by the collector of transistor Q7. The feedback mechanism maintains the proper voltage drop across R1 regardless of changes in the bias conditions of the servo data amplifier due to component tolerances, supply voltage variations, or temperature effects. In addition, the automatic DC restorer stage itself is self-compensating, and will not be affected by any of the above phenomena.

What is claimed is:

1. A dc restore circuit comprising:
   (a) a high impedance input stage;
   (b) a differential amplifier having as inputs the output of said input stage and a reference voltage at a desired dc restore level;
   (c) means forming an active load for said amplifier;
   (d) means coupling said input stage to said amplifier in an isolating manner;
   (e) a capacitor coupled to the output of said amplifier;
   (f) means for generating a current proportional to the voltage of said capacitor; and
   (g) means for generating a voltage drop in said input stage proportional to said current.

2. A circuit according to claim 1 wherein said input stage comprises a first emitter follower with a first resistor in its emitter collector path and said means for generating a voltage drop comprises means to mirror said current proportional to the voltage of said capacitor in said path.

3. A circuit according to claim 2 wherein said means for generating said current comprises a second emitter follower having its base coupled to said capacitor and a second resistor in its emitter collector path.

4. A circuit according to claim 3 wherein said means to mirror comprise third and fourth transistors in the emitter collector paths of said first and second emitter followers respectively, said third and fourth transistors having their bases coupled together, the base of said fourth transistor coupled to its collector.

5. A circuit according to claim 4 wherein said means to isolate comprise a fifth transistor with two emitters of equal area, one coupled to said amplifier and the other providing an output terminal and means for establishing equal current densities in said two emitters.

6. A circuit according to claim 5 wherein said means for establishing comprising sixth and seventh transistors coupled to said two emitters respectively, an eighth transistor coupled to said sixth and seventh transistors as a current mirror and means establishing a controlled current flow through said eighth transistor.

7. A circuit according to claim 1 wherein said amplifier comprises ninth and tenth transistors having their emitter coupled together; and a current source coupled to said emitters.

8. A circuit according to claim 7 wherein said active load comprises an eleventh transistor in series with said ninth transistor; a twelfth transistor in series with said tenth transistor and a thirteenth transistor having its base coupled to the collector of said eleventh transistor and its emitter collector path coupling the bases of said eleventh and twelfth transistors to ground.

* * * * *